(12) United States Patent
Liu et al.

(10) Patent No.: US 8,917,542 B2
(45) Date of Patent: *Dec. 23, 2014

(54) UNIDIRECTIONAL SPIN TORQUE TRANSFER MAGNETIC MEMORY CELL STRUCTURE

(71) Applicant: Micron Technology, Inc., Boise, ID (US)

(72) Inventors: Jun Liu, Boise, ID (US); Gurtej Sandhu, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/746,206

(22) Filed: Jan. 21, 2013

(65) Prior Publication Data

US 2013/0126997 A1  May 23, 2013

Related U.S. Application Data

(62) Division of application No. 13/357,527, filed on Jan. 24, 2012, now Pat. No. 8,358,531, which is a division of application No. 12/242,261, filed on Sep. 30, 2008, now Pat. No. 8,102,700.

(51) Int. Cl.
| | |
|---|---|
| *G11C 11/02* | (2006.01) |
| *G11C 11/14* | (2006.01) |
| *G11C 11/15* | (2006.01) |
| *G11C 11/16* | (2006.01) |
| *H01L 43/02* | (2006.01) |

(52) U.S. Cl.
CPC .............. *H01L 43/02* (2013.01); *G11C 11/16* (2013.01)
USPC ............ 365/158; 365/171; 365/173; 257/421

(58) Field of Classification Search
USPC .......................... 365/158, 171, 173; 257/421
See application file for complete search history.

(56) References Cited

U.S. PATENT DOCUMENTS

| | | | |
|---|---|---|---|
| 6,379,978 B2 | 4/2002 | Goebel et al. | |
| 6,424,563 B2 | 7/2002 | Honigschmid | |
| 6,490,217 B1 | 12/2002 | DeBrosse et al. | |
| 6,496,436 B2 | 12/2002 | Naji | |
| 6,847,547 B2 | 1/2005 | Albert et al. | |
| 6,896,975 B2 | 5/2005 | Lin et al. | |
| 6,967,863 B2 | 11/2005 | Huai | |
| 6,982,916 B2 | 1/2006 | Tsang | |
| 6,992,359 B2 | 1/2006 | Nguyen et al. | |
| 7,009,877 B1 | 3/2006 | Huai et al. | |
| 7,042,762 B2 | 5/2006 | Nakamura et al. | |
| 7,045,368 B2 | 5/2006 | Hong et al. | |

(Continued)

FOREIGN PATENT DOCUMENTS

| | | |
|---|---|---|
| CN | 1894801 | 1/2007 |
| CN | 1938780 | 3/2007 |
| WO | 03092014 | 11/2003 |
| WO | 2008010957 | 1/2008 |

*Primary Examiner* — J. H. Hur
(74) *Attorney, Agent, or Firm* — Fletcher Yoder PC (57) ABSTRACT

Spin torque transfer magnetic random access memory devices configured to be programmed unidirectionally and methods of programming such devices. The devices include memory cells having two pinned layers and a free layer therebetween. By utilizing two pinned layers, the spin torque effect on the free layer from each of the two pinned layers, respectively, allows the memory cells to be programmed with unidirectional currents.

27 Claims, 8 Drawing Sheets

(56) References Cited

U.S. PATENT DOCUMENTS

| | | |
|---|---|---|
| 7,088,609 B2 | 8/2006 | Valet |
| 7,126,202 B2 | 10/2006 | Huai et al. |
| 7,211,874 B2 | 5/2007 | Guo et al. |
| 7,224,601 B2 | 5/2007 | Panchula |
| 7,230,844 B2 | 6/2007 | Deak |
| 7,257,021 B2 | 8/2007 | Lienau et al. |
| 7,282,755 B2 | 10/2007 | Pakala et al. |
| 7,307,876 B2 | 12/2007 | Kent et al. |
| 7,310,265 B2 | 12/2007 | Zheng et al. |
| 7,339,819 B2 | 3/2008 | Johnson |
| 7,369,427 B2 | 5/2008 | Diao et al. |
| 7,372,722 B2 | 5/2008 | Jeong et al. |
| 7,430,135 B2 | 9/2008 | Huai et al. |
| 7,433,161 B2 | 10/2008 | Ikarashi et al. |
| 7,486,552 B2 | 2/2009 | Apalkov et al. |
| 7,532,503 B2 | 5/2009 | Morise et al. |
| 7,688,616 B2 | 3/2010 | Wang et al. |
| 7,742,328 B2 | 6/2010 | Chen et al. |
| 7,760,542 B2 | 7/2010 | Xi et al. |
| 7,876,603 B2 | 1/2011 | Liu et al. |
| 8,102,700 B2 * | 1/2012 | Liu et al. ............ 365/158 |
| 8,310,861 B2 | 11/2012 | Liu et al. |
| 8,358,531 B2 * | 1/2013 | Liu et al. ............ 365/158 |
| 2004/0170055 A1 | 9/2004 | Albert et al. |
| 2005/0136600 A1 * | 6/2005 | Huai ............ 438/296 |
| 2005/0185455 A1 | 8/2005 | Huai |
| 2005/0189574 A1 * | 9/2005 | Nguyen et al. ............ 257/295 |
| 2005/0190594 A1 * | 9/2005 | Nakamura et al. ............ 365/171 |
| 2005/0254286 A1 * | 11/2005 | Valet ............ 365/158 |
| 2006/0062044 A1 | 3/2006 | Jeong et al. |
| 2006/0262594 A1 | 11/2006 | Fukumoto |
| 2008/0049488 A1 | 2/2008 | Rizzo |
| 2008/0061388 A1 | 3/2008 | Diao et al. |
| 2008/0180991 A1 | 7/2008 | Wang |
| 2008/0197431 A1 | 8/2008 | Hirofumi et al. |
| 2008/0225585 A1 | 9/2008 | Ranjan et al. |
| 2008/0265234 A1 | 10/2008 | Breitwisch et al. |
| 2008/0291721 A1 * | 11/2008 | Apalkov et al. ............ 365/173 |
| 2008/0310214 A1 * | 12/2008 | Wang et al. ............ 365/158 |

* cited by examiner

FIG. 12

UNIDIRECTIONAL SPIN TORQUE TRANSFER MAGNETIC MEMORY CELL STRUCTURE

CROSS-REFERENCE TO RELATED APPLICATION

This application is a divisional of U.S. patent application Ser. No. 13/357,527, which was filed on Jan. 24, 2012, now U.S. Pat. No. 8,358,531, which issued on Jan. 22, 2013, which is a divisional of U.S. patent application Ser. No. 12/242,261, which was filed on Sep. 30, 2008, now U.S. Pat. No. 8,102,700, which issued on Jan. 24, 2012.

BACKGROUND

1. Field of Invention

The invention relates generally to magnetic random access memory, and more particularly, to Spin Torque Transfer Magnetic Random Access Memory (STT-MRAM).

2. Description of Related Art

This section is intended to introduce the reader to various aspects of the art that may be related to various aspects of the present invention, which are described and/or claimed below. This discussion is believed to be helpful in providing the reader with background information to facilitate a better understanding of the various aspects of the present invention. Accordingly, it should be understood that these statements are to be read in this light and not as admissions of prior art.

Magnetic Random Access Memory (MRAM) is a non-volatile computer memory technology based on magnetoresistance. MRAM differs from volatile Random Access Memory (RAM) in several respects. Because MRAM is non-volatile, MRAM can maintain memory content when the memory device is not powered. Though non-volatile RAM is typically slower than volatile RAM, MRAM has read and write response times that are comparable to that of volatile RAM. Unlike typical RAM technologies which store data as electric charge, MRAM data is stored by magnetoresistive elements. Generally, the magnetoresistive elements are made from two magnetic layers, each of which holds a magnetization. The magnetization of one layer (the "pinned layer") is fixed in its magnetic orientation, and the magnetization of the other layer (the "free layer") can be changed by an external magnetic field generated by a programming current. Thus, the magnetic field of the programming current can cause the magnetic orientations of the two magnetic layers to be either parallel, giving a lower electrical resistance across the layers ("1" state), or antiparallel, giving a higher electrical resistance across the layers ("0" state). The switching of the magnetic orientation of the free layer and the resulting high or low resistance states across the magnetic layers provide for the write and read operations of the typical MRAM cell.

Though MRAM technology offers non-volatility and faster response times, the MRAM cell is limited in scalability and susceptible to write disturbances. The programming current employed to switch between high and low resistance states across the MRAM magnetic layers is typically high. Thus, when multiple cells are arranged in an MRAM array, the programming current directed to one memory cell may induce a field change in the free layer of an adjacent cell. This potential for writes disturbances, also known as the "half-select problem," can be addressed using a spin torque transfer technique.

A conventional spin torque transfer MRAM (STT-MRAM) cell includes a magnetic tunnel junction (MTJ), which is a magnetoresistive data storing element including two magnetic layers (one pinned and one free) and an insulating layer in between, a bit line, a word line, a source line, and an access transistor. A programming current typically flows through the access transistor and the MTJ. The pinned layer polarizes the electron spin of the programming current, and torque is created as the spin-polarized current passes through the MTJ. The spin-polarized electron current interacts with the free layer by exerting a torque on the free layer. When the torque of the spin-polarized electron current passing through the MTJ is greater than the critical switching current density ($J_c$), the torque exerted by the spin-polarized electron current is sufficient to switch the magnetization of the free layer. Thus, the magnetization of the free layer can be aligned to be either parallel or antiparallel to the pinned layer, and the resistance state across the MTJ is changed.

The STT-MRAM has advantageous characteristics over the MRAM because the spin-polarized electron current eliminates the need for an external magnetic field to switch the free layer in the magnetoresistive elements. Further, scalability is improved as the programming current decreases with decreasing cell sizes, and the writing disturbance and half-select problem is addressed.

Additionally, STT-MRAM technology allows for a higher tunnel magnetic resistance ratio, meaning there is a larger ratio between high and low resistance states, improving read operations in the magnetic domain.

However, the STT-MRAM cell structure utilizes programming currents of bidirectional polarity to program the magnetic cell into the high and low resistance states. Bidirectional programming logic requires more silicon space to form the memory cell and is generally more complicated and less efficient than unidirectional programming logic.

BRIEF DESCRIPTION OF DRAWINGS

Certain embodiments are described in the following detailed description and in reference to the drawings in which.

DETAILED DESCRIPTION

A spin torque transfer magnetic random access memory (STT-MRAM) cell is programmed by switching the magnetization of the free layer in the cell's magnetic tunnel junction (MTJ). A programming current of bidirectional polarity is generally utilized to switch the magnetization of the free layer and program the cell. However, a STT-MRAM cell that is capable of being programmed into high and low resistance states with a unidirectional current would be more efficient and require less silicon space than the conventional bidirectional STT-MRAM cell. In accordance with embodiments of the present invention, a STT-MRAM cell structure may be designed to create an imbalance between two opposing spin torque transfer effects to enable unidirectional current programming. The following discussion describes the systems and devices, and the operation of such systems and devices in accordance with the embodiments of the present technique.

Figure 1:
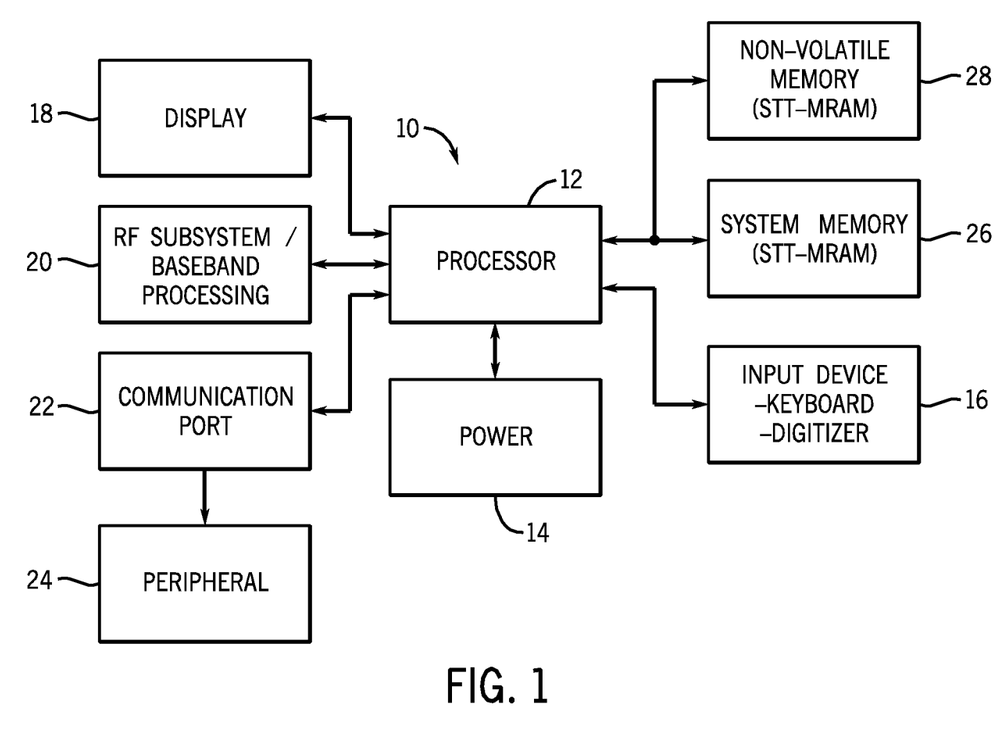
FIG. 1 depicts a block diagram of a processor-based system in accordance with an embodiment of the present technique.

FIG. 1 depicts a processor-based system, generally designated by reference numeral 10. As is explained below, the system 10 may include various electronic devices manufactured in accordance with embodiments of the present technique. The system 10 may be any of a variety of types such as a computer, pager, cellular phone, personal organizer, control circuit, etc. In a typical processor-based system, one or more processors 12, such as a microprocessor, control the processing of system functions and requests in the system 10. As is explained below, the processor 12 and other subcomponents of the system 10 may include resistive memory devices manufactured in accordance with embodiments of the present technique.

The system 10 typically includes a power supply 14. For instance, if the system 10 is a portable system, the power supply 14 may advantageously include a fuel cell, a power scavenging device, permanent batteries, replaceable batteries, and/or rechargeable batteries. The power supply 14 may also include an AC adapter, so the system 10 may be plugged into a wall outlet, for instance. The power supply 14 may also include a DC adapter such that the system 10 may be plugged into a vehicle cigarette lighter, for instance.

Various other devices may be coupled to the processor 12 depending on the functions that the system 10 performs. For instance, a user interface 16 may be coupled to the processor 12. The user interface 16 may include buttons, switches, a keyboard, a light pen, a mouse, a digitizer and stylus, and/or a voice recognition system, for instance. A display 18 may also be coupled to the processor 12. The display 18 may include an LCD, an SED display, a CRT display, a DLP display, a plasma display, an OLED display, LEDs, and/or an audio display, for example. Furthermore, an RF sub-system/baseband processor 20 may also be coupled to the processor 12. The RF sub-system/baseband processor 20 may include an antenna that is coupled to an RF receiver and to an RF transmitter (not shown). One or more communication ports 22 may also be coupled to the processor 12. The communication port 22 may be adapted to be coupled to one or more peripheral devices 24 such as a modem, a printer, a computer, or to a network, such as a local area network, remote area network, intranet, or the Internet, for instance.

The processor 12 generally controls the system 10 by implementing software programs stored in the memory. The software programs may include an operating system, database software, drafting software, word processing software, and/or video, photo, or sound editing software, for example. The memory is operably coupled to the processor 12 to store and facilitate execution of various programs. For instance, the processor 12 may be coupled to the system memory 26, which may include spin torque transfer magnetic random access memory (STT-MRAM), magnetic random access memory (MRAM), dynamic random access memory (DRAM), and/or static random access memory (SRAM). The system memory 26 may include volatile memory, non-volatile memory, or a combination thereof. The system memory 26 is typically large so that it can store dynamically loaded applications and data. In some embodiments, the system memory 26 may include STT-MRAM devices, such as those discussed further below.

The processor 12 may also be coupled to non-volatile memory 28, which is not to suggest that system memory 26 is necessarily volatile. The non-volatile memory 28 may include STT-MRAM, MRAM, read-only memory (ROM), such as an EPROM, resistive read-only memory (RROM), and/or flash memory to be used in conjunction with the system memory 26. The size of the ROM is typically selected to be just large enough to store any necessary operating system, application programs, and fixed data. Additionally, the non-volatile memory 28 may include a high capacity memory such as a tape or disk drive memory, such as a hybrid-drive including resistive memory or other types of non-volatile solid-state memory, for instance. As is explained in greater detail below, the non-volatile memory 28 may include STT-MRAM devices manufactured in accordance with embodiments of the present technique.

Figure 2:
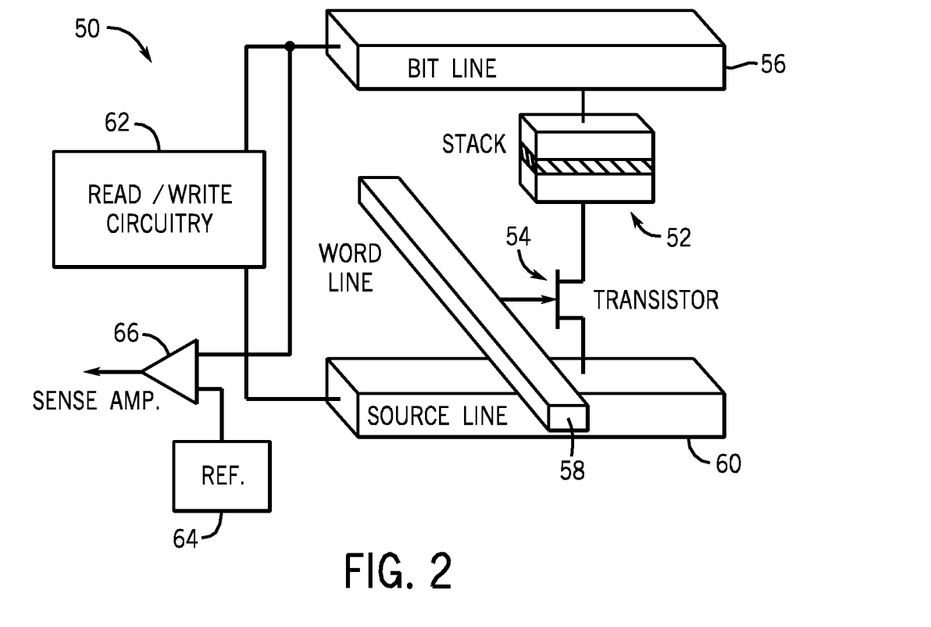
FIG. 2 depicts a schematic diagram of a portion of a memory array having memory cells fabricated in accordance with embodiments of the present invention.

FIG. 2 illustrates an STT-MRAM cell 50, which may be fabricated to form an array of memory cells in a grid pattern including a number of rows and columns, or in various other arrangements depending on the system requirements and fabrication technology. An arrangement of memory cells may be implemented in the system memory 26 or the volatile memory 28 depicted in FIG. 1.

The STT-MRAM cell 50 includes a stack 52, an access transistor 54, a bit line 56, a word line 58, a source line 60, read/write circuitry 62, a bit line reference 64, and a sense amplifier 66. The stack 52 may include a magnetic tunnel junction (MTJ), including a free layer, and a pinned layer. As will be described further below with specific reference to FIGS. 3 and 5-11, the "stack" 52 may refer to multiple free layers and pinned layers, a heat generating layer, a piezoelectric material, nonmagnetic layers, and additional MTJ components in accordance with embodiments of the present technique.

In various embodiments described below, the heat generating layer is referred to as a "layer" when the material is formed above or below the MTJ or a pinned layer in the stack, or parallel to the layers of the MTJ or stack. As also used herein, it should be understood that when a layer is said to be "formed on" or "disposed on" another layer, there may be intervening layers formed or disposed between those layers. Similarly, if materials are said to be "adjacent" to other materials, there may be intervening materials therebetween. Conversely, if a layer or material is said to be "formed directly on," "disposed directly on," or formed/disposed "directly adjacent to" or "in direct contact with," the materials or layers include no intervening materials or layers therebetween.

When the STT-MRAM cell 50 is selected to be programmed, a programming current is applied to the cell, and the current is spin-polarized by one of the pinned layers and exerts a torque on the free layer, which switches the magnetization of the free layer to "write to" or "program" the cell. In a read operation of the STT-MRAM cell 50, a current is used to detect the resistance state of the memory cell stack 52. Further, incorporating a piezoelectric layer in the stack 52 may decrease the critical switching current required to switch the magnetization of the free layer, thus allowing a smaller programming current to write the STT-MRAM cell 50.

As previously discussed, a programming current (or a "write current") is applied for the write operation of the STT-MRAM cell 50. To initiate the write operation, the read/write circuitry 62 may generate a write current to the bit line 56. As will be further described, the current density of the write current determines the switch in magnetization of the free layer in the stack 52. Once the free layer is magnetized according to the current density of the programming current, the programmed state is written to the STT-MRAM cell 50. Thus, the STT-MRAM cell 50 may be programmed by a unidirectional current, enabling a simpler unidirectional programming logic on the STT-MRAM cell 50. The conventional STT-MRAM cell changes between low and high resistance states by driving a write current in opposite directions, requiring bidirectional programming logic. For example, a write current would be driven from a transistor source to a transistor drain, and then through a MTJ to program the memory cell to a high resistance state. To program a memory cell to a low resistance state, a write current would be driven from a MTJ to a transistor drain to a transistor source. In the embodiments in accordance with the present technique, such bidirectional programming logic may not be necessary, as a unidirectional current may program the STT-MRAM cell 50. As will be explained in FIG. 12, in some embodiments, the STT-MRAM cell 50 may be implemented in a cross point architecture to decrease the size of a STT-MRAM array.

To read the STT-MRAM cell 50, the read/write circuitry 62 generates a read current to the bit line 56 and the source line 60 through the stack 52 and the transistor 54. The programmed state of the STT-MRAM cell 50 depends on the resistance across the stack 52 which may be determined by the voltage difference between the bit line 56 and the source line 60. In some embodiments, the voltage difference may be compared to a reference 64 and amplified by a sense amplifier 66.

Figure 3:
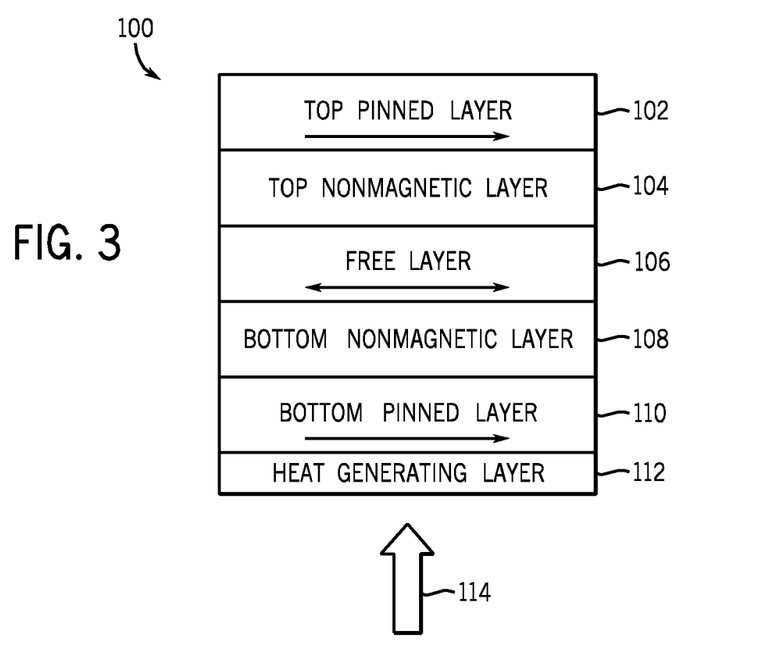
FIG. 3 depicts a portion of a STT-MRAM cell in accordance with embodiments of the present invention.

One embodiment of the present invention, a STT-MRAM cell capable of being programmed by a unidirectional current, is depicted in FIG. 3. Each of the stacks illustrated and described below may be incorporated in the STT-MRAM cell 50, described in FIG. 2. The STT-MRAM cell stack 100 includes a top pinned layer 102, separated from a free layer 106 by a top nonmagnetic layer 104, and a bottom pinned layer 110, separated from the free layer 106 by a bottom nonmagnetic layer 108. As discussed further below, the pinned layers 102 and 110 and the free layer 106 are typically ferromagnetic materials. The top and bottom nonmagnetic layers 104 and 108 may serve as insulators between the free layer 106 and the top and bottom pinned layers 102 and 110. The memory cell stack 100 may also include a heat generating layer 112.

The memory cell may be programmed by switching the magnetization of the free layer 106 in the memory cell stack 100, and the cell may be read by determining the resistance across the top pinned layer 102, the free layer 106 and the bottom pinned layer 110. The unidirectional arrow illustrated in each of the top pinned layer 102 and the bottom pinned layer 110 represent that the pinned layers 102 and 110 have a fixed magnetization. Furthermore, the magnetization of the top pinned layer 102 and the bottom pinned layer 110 are orientated in the same direction. The bidirectional arrow illustrated in the free layer 106 represents that the free layer 106 may be switched to have a magnetization in a direction parallel to the bottom pinned layer 110, which gives a low resistance, or in a direction antiparallel to the bottom pinned layer 110, which gives a high resistance.

The structure of the cell stack 100 and the parallel magnetizations of the top pinned layer 102 and the bottom pinned layer 110 may enable the memory cell to be programmed with a unidirectional current. More specifically, when a memory cell is selected to be programmed to a low resistance state, a programming current 114 is applied to the cell. The programming current 114 used to program the stack 100 to a low resistance state may be in the range of about 20 microamperes to about 1 miliampere. As the programming current 114 travels through stack 100, the electron spin of the programming current 114 is first polarized by the bottom pinned layer 110. When the spin polarized programming current 114 then reaches the free layer 106, it aligns the free layer 106 to have the same magnetization as the bottom pinned layer 110. If the current continues to the top pinned layer 102, the magnetization of the top pinned layer 102 will not change since the programming current 114 was polarized in the same direction by the bottom pinned layer 110. The magnetization of the free layer 106 is the same as the magnetization of the bottom pinned layer 110, and the memory cell is programmed to a low resistance state.

If the memory cell is selected to be programmed to a high resistance state, a larger programming current 114 travels through stack 100. The programming current 114 used to program the stack 100 to a high resistance state may be in the range of about 50 microamperes to about 1.5 miliampere. The larger current may generate greater heat in the heat generating layer 112 to locally heat up the bottom pinned layer 110 to reduce its magnetization and spin polarization efficiency. Though the heat generating layer 112 is shown in this embodiment as a means of modulating the spin torque effect of the bottom pinned layer 110, this embodiment and other embodiments of the present technique may also implement other approaches or combinations of different approaches for modulating the imbalance between the opposing spin torques. For example, some embodiments may use voltage-induced stress, including but not limited to using piezoelectric materials within the STT-MRAM cell.

Since the bottom pinned layer 110 has decreased magnetization and spin polarization efficiency in response to the larger programming current 114, the programming current will pass the bottom pinned layer 110 either unpolarized or not highly polarized. The programming current 114 will then travel through the free layer 106 and to the top pinned layer 102. The top pinned layer 102 will reflect the electrons of the programming current 114 that have spin polarized to the opposite direction of the magnetization of the top pinned layer 102. The reflected electrons with spin polarization opposite from the top pinned layer 102 will then switch the magnetization of the free layer 106 such that the magnetization of the free layer 106 is antiparallel to the magnetization of both the top and the bottom pinned layers 102 and 110, and the memory cell is programmed to a high resistance state.

Thus, a unidirectional current may program a memory cell to either a low resistance state or a high resistance state. The spin torque effect on the free layer 106 from the current polarized by the bottom pinned layer 110 is opposite to the spin torque effect on the free layer 106 from the current reflected by the top pinned layer 102. The structure of the stack 100 in this embodiment and the parallel magnetization of the two pinned layers 102 and 110 enable the spin torque effect of the bottom pinned layer 102 to dominate at a low current density, and the spin torque effect of the top pinned layer 102 to dominate at a high current density. Therefore, the programming current 114 need only be varied in current density, and not in direction.

The top pinned layer 102, free layer 106, and bottom pinned layer 110 may comprise ferromagnetic materials, including but not limited to materials such as Co, Fe, Ni or its alloys, NiFe, CoFe, CoNiFe, or doped alloys CoX, CoFeX, CoNiFeX (X=B, Cu, Re, Ru, Rh, Hf, Pd, Pt, C), or other half-metallic ferromagnetic material such as $Fe_3O_4$, $CrO_2$, NiMnSb and PtMnSb, and BiFeO. The heat generating layer 112 may comprise refractory metals including, for example, nitride, carbide, and Boride, TiN, ZrN, HfN, VN, NbN, TaN, TiC, ZrC, HfC, VC, NbC, TaC, TiB2, ZrB2, HfB2, VB2, NbB2, TaB2, Cr3C2, Mo2C, WC, CrB2, Mo2B5, W2B5, or compounds such as TiAlN, TiSiN, TiW, TaSiN, TiCN, SiC, B4C, WSix, MoSi2, or elemental materials such as doped silicon, carbon, Pt, Niobium, Tungsten, molybdenum, or metal alloys such as NiCr, for example. The top nonmagnetic layer 104 and bottom nonmagnetic layer 108 can be either conductive or nonconductive. In some embodiments, conductive nonmagnetic layers may comprise Cu, Au, Ta, Ag, CuPt, CuMn, or other nonmagnetic transition metals, or any combination of the above nonmagnetic conductive materials. Nonconductive nonmagnetic layers may comprise $Al_xO_y$, MgO, AlN, SiN, $CaO_x$, $NiO_x$, $HfO_2$, $Ta_2O_5$, $ZrO_2$, $NiMnO_x$, $MgF_2$, SiC, $SiO_2$, $SiO_xN_y$, or any combination of the above nonmagnetic nonconductive materials.

Figure 4:
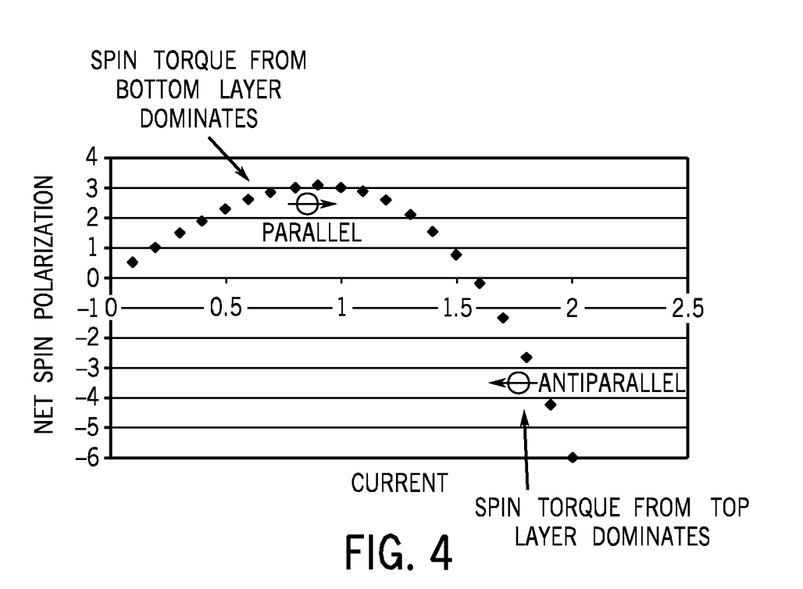
FIG. 4 depicts a chart relating programming current and net spin polarization of a memory cell in accordance with embodiments of the present invention.

The chart illustrated in FIG. 4 represents the relationship between an applied programming current and the net spin polarization between the free and pinned layers, according to one embodiment of the present invention. The positive values in the net spin polarization axis represent that the free layer is parallel to the bottom pinned layer. This condition results when the programming current is smaller, and the spin torque from the bottom pinned layer dominates and switches the free layer to be parallel to the bottom pinned layer. The negative values in the net spin polarization axis represent that the free layer is antiparallel to the bottom pinned layer. This condition results when the programming current is larger, and local heating decreases the spin torque from the bottom layer, such that the spin torque from the top pinned layer dominates and reflects the polarized electron current that switches the free layer to be antiparallel to the bottom pinned layer.

As previously discussed, the nonmagnetic layers separating a free layer from a pinned layer in a STT-MRAM cell stack can be conductive or nonconductive. Furthermore, a memory cell stack may comprise a combination of conductive or nonconductive nonmagnetic layers. If either or both of the nonmagnetic layers are nonconductive, the memory cell stack may provide a good sensing margin, meaning that the separation between the two programmable states of low and high resistivity are greater. For example a desirable resistance ratio in some embodiments may range from 100-300%. However, it may sometimes be advantageous to construct a memory cell where all the nonmagnetic layers are conductive. In such embodiments, the resistance change may not be as large as a memory cell with nonconductive nonmagnetic layers. Adding a magnetic tunnel junction (MTJ) may improve the sensing margin, or increase the resistance change of a memory cell.

Figure 5:
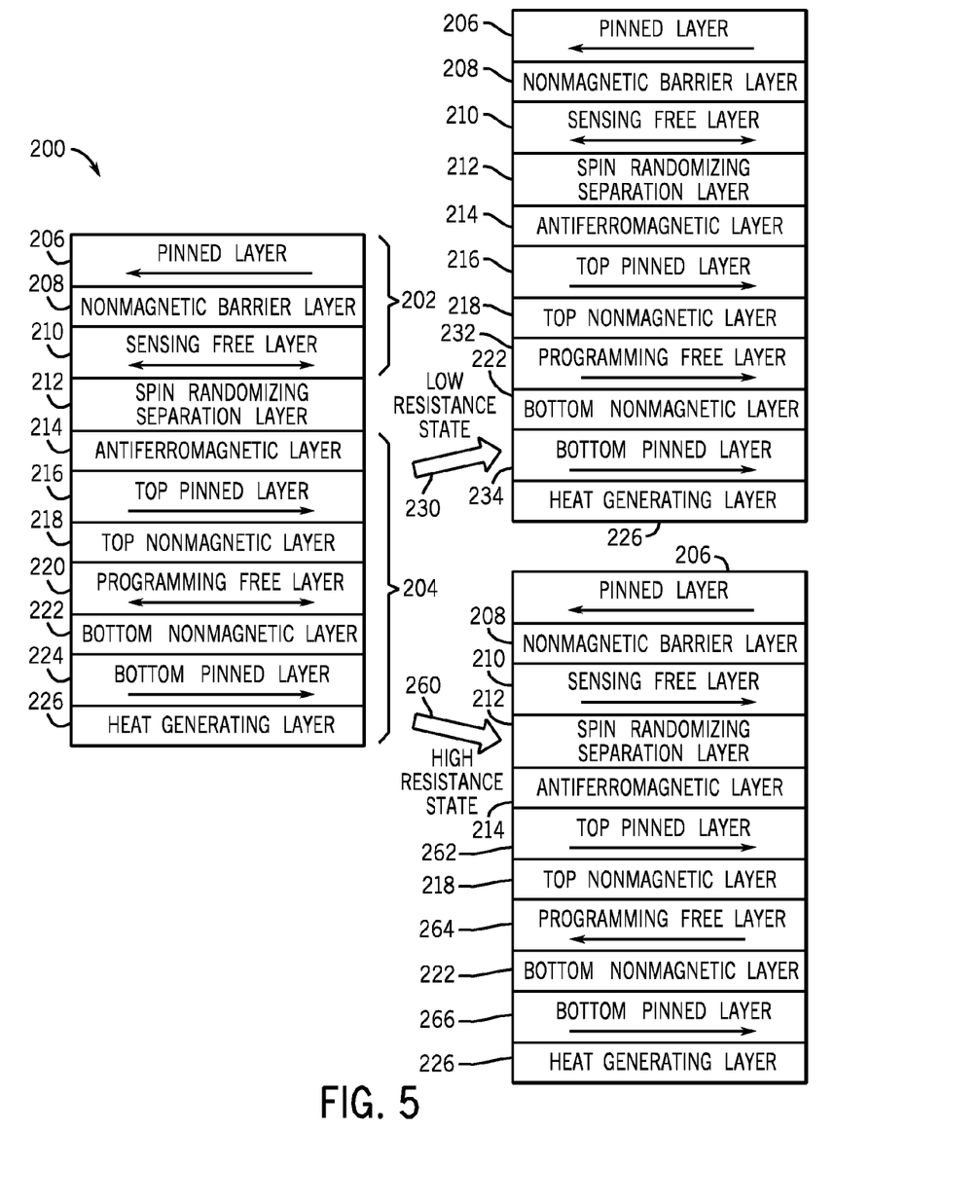
FIG. 5 depicts a portion of a STT-MRAM cell with an additional magnetic tunnel junction, as well as portions of STT-MRAM cells in low and high resistance states, in accordance with embodiments of the present invention.

FIG. 5 illustrates one embodiment of the present invention which includes an additional MTJ to improve the sensing margin of a memory cell. The memory cell stack 200 includes a bottom unidirectional programming stack 204 with a programming free layer 220 stacked between a top pinned layer 216 and a bottom pinned layer 224. The bottom unidirectional programming stack 204 may further include a top nonmagnetic layer 218 between the programming free layer 220 and the top pinned layer 216, and a bottom nonmagnetic layer 222 between the programming free layer 220 and the bottom pinned layer 224. The nonmagnetic layers 218 and 222 may be either conductive or nonconductive, and may insulate the magnetization of the surrounding layers. When a low programming current passes through from the bottom of the stack 200, the bottom pinned layer may spin polarize the current, and the spin polarized programming current switches the magnetization of the programming free layer 220. When a high programming current passes through from the bottom of the stack 200, the larger heat from the larger current and the heat generated by the heat generating layer 226 decrease the magnetization of the bottom pinned layer 224 such that the programming current, still non-polarized or not highly polarized, travels to the top pinned layer 216 where it is spin polarized and reflected back to the programming free layer 220 to switch the programming free layer 220 to be antiparallel to the bottom pinned layer 224. The original portion 204 may further comprise an antiferromagnetic layer 214 on top of the top pinned layer 216 to help pin the top pinned layer 216 and maintain its magnetization and stability.

The memory cell stack 200 may also comprise an additional MTJ 202, with a pinned layer 206 and a sensing free layer 210 separated from pinned layer 206 by a nonmagnetic barrier layer 208. The additional MTJ 202 may improve the sensing margin and increase the resistance ratio of the memory cell. The additional MTJ 202 is magnetostatically coupled to be antiparallel to a programming free layer 220 in the bottom unidirectional programming stack 204, such that changing the magnetization of the programming free layer 220 will change the magnetization of the sensing free layer 210. Further, the additional MTJ 202 may be separated from the bottom unidirectional programming stack 204 by a spin randomizing separation layer 212. The spin randomizing separation layer 212 randomizes the spin of the programming current and may eliminate or reduce any coupling effects between the sensing free layer 210 and the antiferromagnetic layer 214.

The antiparallel magneto static coupling of the sensing free layer 210 to the programming free layer 220 may improve the sensing margin and the resistance ratio between the two programmed states. The two programmed states include a low resistance state 230 and a high resistance state 260. In the low resistance state 230, the programming current is spin polarized by the bottom pinned layer 234 and switches the magnetization of the programming free layer 232 to be parallel to the magnetization of the bottom pinned layer 234. In the high resistance state 260, the programming current travels through the bottom pinned layer 268 and is spin polarized by the top pinned layer 262 and reflected to switch the programming free layer 264 in a magnetization antiparallel to the bottom pinned layer 266.

Figure 6:
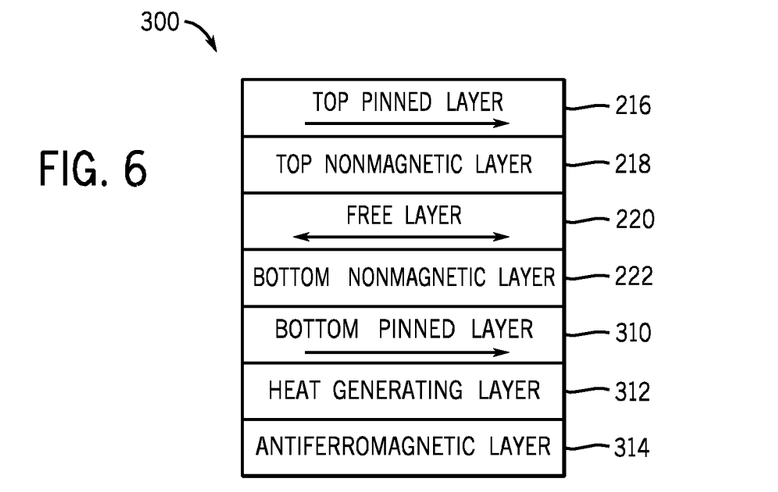
FIGS. 6-11 depict portions of STT-MRAM cells in accordance with various embodiments of the present invention.

FIG. 6 illustrates one embodiment where an antiferromagnetic layer 314 is added to the memory cell stack 300 to help pin the bottom pinned layer 310 and maintain stability of the memory cell. As previously discussed, the bottom pinned layer 310 may have decreased magnetization and spin polarization efficiency when heat is applied, such that a current may pass the bottom pinned layer 310 with less polarization to be spin polarized by the top pinned layer 302 and reflected to switch the free layer 306. The heat from a larger programming current may reduce magnetization, and a heat generating layer 312 may further decrease the magnetization and spin polarization efficiency of the bottom pinned layer 310. The heat generating layer 312 may also provide antiferromagnetic coupling between the antiferromagnetic layer 314 and the bottom pinned layer 310.

Figure 7:
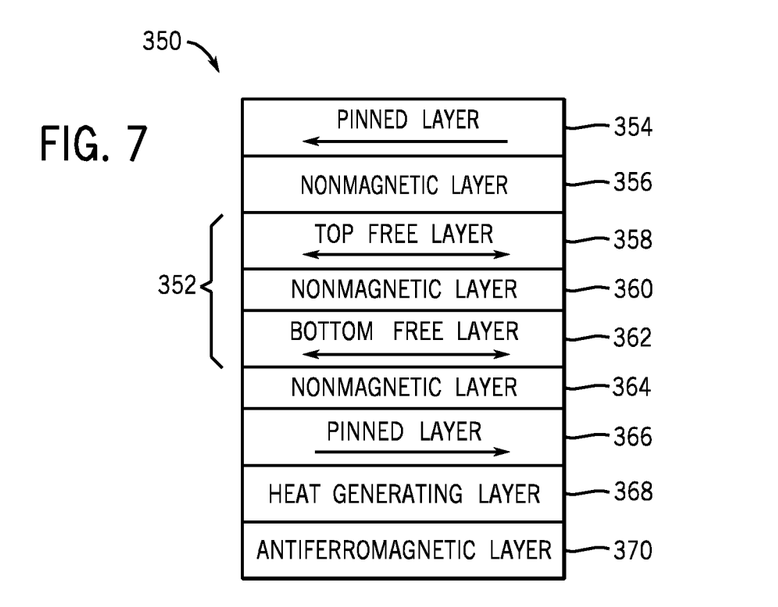

In another embodiment, as depicted in FIG. 7, a "synthetic free layer" 352 replaces a free layer in a memory cell stack 350. As used herein, a "synthetic layer" refers to a structure having a nonmagnetic layer sandwiched between two ferromagnetic layers, which may have opposite magnetization, as described below. Referring again to FIG. 7, the synthetic free layer 352 may include a top free layer 358 and a bottom free layer 362 with a nonmagnetic layer 360 in between to promote antiferromagnetic coupling between the two free layers 358 and 362 such that the two free layers 358 and 362 are always opposite in magnetization. The top free layer 358 is coupled to the top nonmagnetic layer 356, and the bottom free layer 362 is coupled to the bottom nonmagnetic layer 364. Thus, to program the memory cell, the programming current switches both free layers 358 and 362. Therefore, in this embodiment, the top pinned layer 354 may be opposite in magnetization from the bottom pinned layer 366.

To program a cell to a low resistance state, a programming current entering the bottom of the stack 350 would be spin polarized by the bottom pinned layer 366 and would flip the bottom free layer 362 and then the top free layer 358. The bottom free layer 362 would have the same magnetization as the bottom pinned layer 366. To program a cell to a high resistance state, a large programming current would be applied, and the increased heat from the large programming current, and the heat generated by the heat generating layer 368 would decrease the magnetization and spin polarization efficiency of the bottom pinned layer 366. Thus, the large programming current would pass the bottom pinned layer 366 with low polarization to be spin polarized by the top pinned layer 354, which has an opposite magnetization from the bottom pinned layer 366. The spin polarized programming current reflected from the top pinned layer 366 would switch the top free layer 358, and then the bottom free layer 362. The bottom free layer 362 would have the opposite magnetization as the bottom pinned layer 366. Further, an antiferromagnetic layer 370 may also be added to the memory cell stack 350 to help pin the bottom pinned layer 366 and maintain stability of the memory cell.

Figure 8:
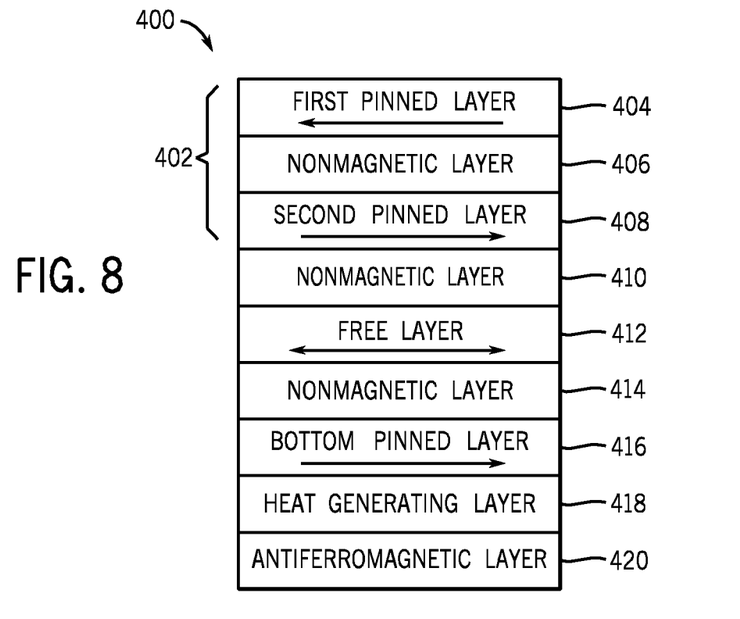

Another embodiment of the present invention, illustrated in FIG. 8, includes a STT-MRAM cell stack 400 with a "synthetic top pinned layer" 402 which replaces a top pinned layer in the previously described embodiments. The synthetic top pinned layer 402 may include a first pinned layer 404 and a second pinned layer 408 separated by a nonmagnetic layer 406. The nonmagnetic layer 406 promotes antiferromagnetic coupling between the surrounding pinned layers 404 and 408, and may comprise conductive nonmagnetic material, such as Ru, Ir and Re. Because the two pinned layers 404 and 408 of the synthetic top pinned layer 402 are coupled through the nonmagnetic layer 406, the two pinned layers 404 and 408 may be less affected by an incoming programming current and will keep magnetization even when temperature rises or when spin polarization occurs. The pinned layers 404 and 408 are thus less susceptible to spin polarizing effects and maintain their fixed magnetizations, thus improving the memory cell integrity. An antiferromagnetic layer 420 may also be added to the memory cell stack 400 to help pin the bottom pinned layer 416 and maintain stability of the memory cell. Further, the heat generating layer also provides antiferromagnetic coupling between the bottom pinned layer 416 and the antiferromagnetic layer 420.

Figure 9:
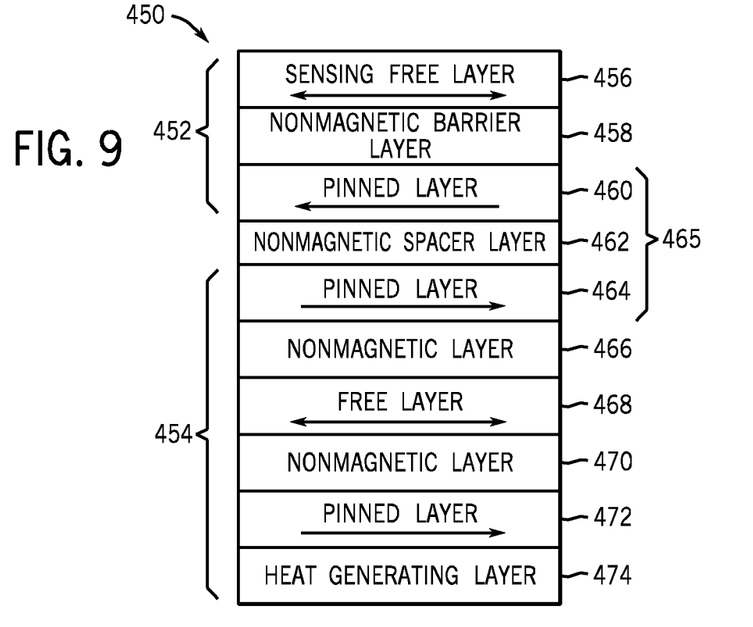

FIG. 9 depicts yet another embodiment of the present invention with an additional MTJ 452 in a memory cell stack 450. The additional MTJ 452 includes a sensing free layer 456 and a pinned layer 460, separated by a nonmagnetic barrier layer 458 to insulate the magnetizations of the sensing free layer 456 and the pinned layer 460. The sensing free layer 456 is magnetostatically coupled to the free layer 468 to be antiparallel, thus improving the sensing margin. The additional MTJ 452 may be separated from the bottom unidirectional programming cell stack 454 by a nonmagnetic layer 462, which promotes antiferromagnetic coupling between the surrounding pinned layers 460 and 464. As will be appreciated, the pinned layer 460, the nonmagnetic layer 462 and the pinned layer 464 make up a synthetic top pinned layer 465. The synthetic top pinned layer 465 is a portion of both MTJ 452 and the unidirectional programming cell stack 454.

Figure 10:
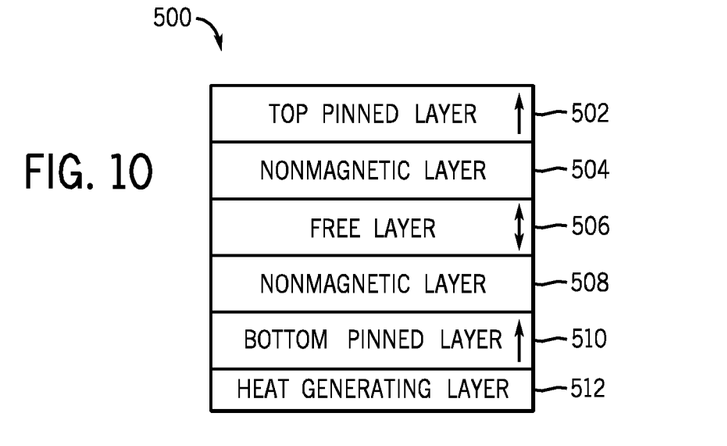

As known by those skilled in the art, a ferromagnetic layer with a magnetization perpendicular to the plane of the layer may utilize a lower programming current to switch magnetization. Thus, another embodiment of the present invention may include ferromagnetic layers with magnetization perpendicular to the layer plane, as depicted in FIG. 10. As used herein a "layer plane" refers to the horizontal plane in which the associated layer is disposed. A STT-MRAM cell stack 500 includes a top pinned layer 502, separated by a top nonmagnetic layer 504 from a free layer 506, and a bottom pinned layer 510 separated by a bottom nonmagnetic layer 508 from the free layer 506. The stack may further comprise a heat generating layer 512. The unidirectional arrows illustrated in the top and bottom pinned layers 502 and 510 represent their fixed magnetization and are oriented perpendicularly to the layer plane. The bidirectional arrow illustrated in the free layer 506 represents that the magnetization of the free layer 506 may switch, depending on whether the memory cell is selected to be programmed to a low or high resistance state. As previously described, the structure of stack 500 enables a unidirectional programming current to switch the magnetization of the free layer 506 in either a direction parallel or antiparallel to the bottom pinned layer 510. Further, a smaller programming current may enable such resistance changes due to the perpendicular magnetization of the layers in relation to their layer planes.

Figure 11:
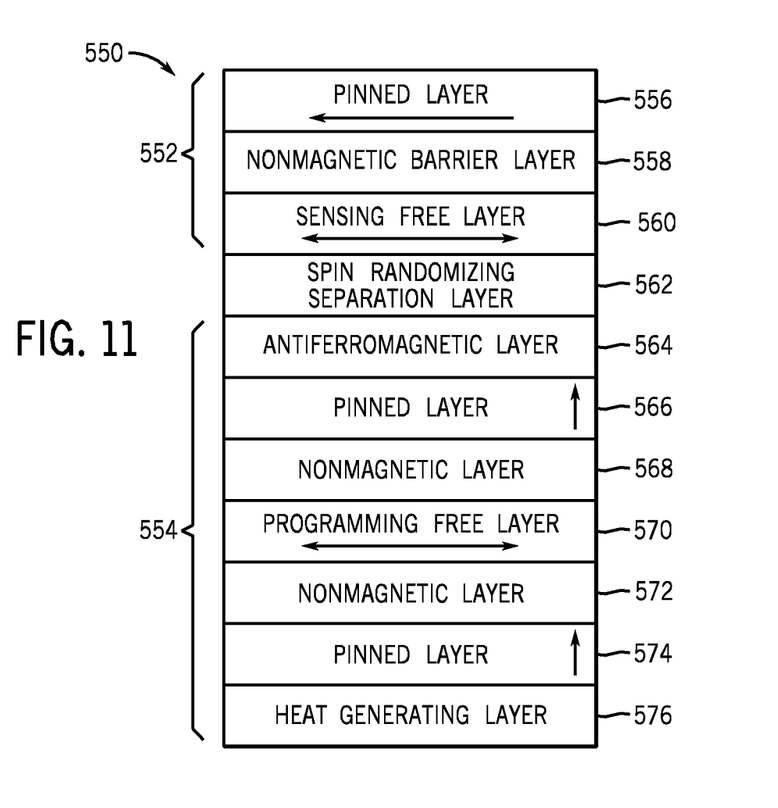

The magnetization of the free layer 506 from FIG. 10 does not necessarily have to be perpendicular to the plane of the layer in other embodiments, as illustrated in FIG. 11. In another embodiment, a memory cell stack 550 comprises a top pinned layer 566 and a bottom pinned layer 574 having magnetizations perpendicular to the layer plane, and a programming free layer 570 having a magnetization parallel to the layer plane. This structure may help to increase the programming speed of the memory cell because of the interaction between the electron spin of the programming current and the magnetization of the programming free layer 570. Less time is needed for the programming free layer 570 to switch in magnetization. An additional MTJ 552 with a sensing free layer 560 may be magnetostatically coupled to the programming free layer 570 to be antiparallel, thus improving the sensing margin between the two programmed states. Further, even if there is no resistance change between the magnetizations of the free and pinned layers 566, 570, and 574 since the direction of magnetizations are perpendicular, the resistance change may be read from the additional MTJ 552.

Figure 12:
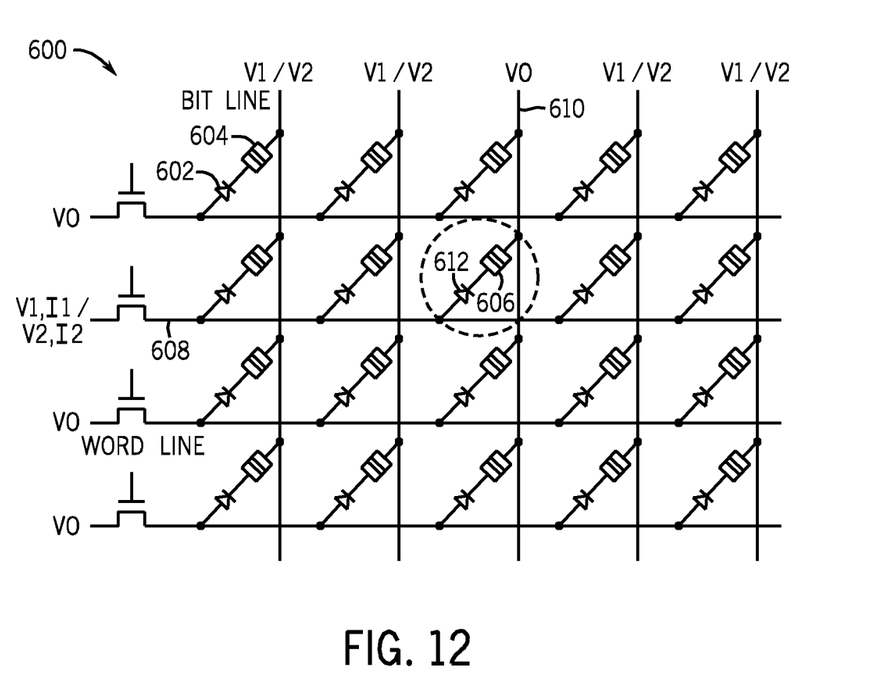
FIG. 12 depicts a portion of a memory array implementing cross point architecture in accordance with embodiments of the present invention.

As depicted in FIG. 12, STT-MRAM cells may be arranged in an array implementing cross point architecture in accordance with an embodiment of the present invention.

In the architecture 600, a rectifying device 602 is applied to the STT-MRAM cell 604. The rectifying device 602 may enable a current path to a selected cell 606 and isolate non-selected cells by blocking the current path. In this embodiment, a diode is used as the rectifying device 602, but any suitable rectifying device or any suitable biasing scheme may be used to enable the current path to a selected cell 606 and block the current path to non-selected cells.

To program a STT-MRAM cell to a low resistance state, a voltage V1 is applied to a word line 608 connected to the selected cell 606, and a lower voltage V0 is applied to the rest of the word lines. A lower voltage V0 (a voltage lower than V1) is applied to a bit line 610 connected to the selected cell 606 to forward bias the rectifying device 612 of the selected cell 606 and create a programming current I1 flowing through the selected cell 606. The rest of the bit lines are biased at V1 (or a voltage higher than V0) to reverse bias the other rectifying devices and block the current to the non-selected cells.

This enables the selected STT-MRAM cell 606 to be programmed to a low resistance state with a unidirectional current, in accordance with the present technique.

To program a STT-MRAM cell to a high resistance state, a voltage V2 is applied to the word line 608 connected to the selected cell 606. When programming a selected cell 606 to a high resistance state, the voltage V2 applied across the rectifying device 612 and the selected cell 606 is larger than V1. As previously discussed, this may induce a larger programming current I2 through the selected cell 606 to program the selected cell 606 to a high resistance state. The non-selected word lines are again biased at V0 (a voltage lower than V2), and non-selected bit lines are biased at V2 (a voltage higher than V0) to reverse bias the other rectifying devices so that the non-selected cells will not be disturbed by the write operation. Thus, the selected STT-MRAM cell 606 may be programmed to a high resistance state with a unidirectional current.

While the invention may be susceptible to various modifications and alternative forms, specific embodiments have been shown by way of example in the drawings and have been described in detail herein. However, it should be understood that the invention is not intended to be limited to the particular forms disclosed. Rather, the invention is to cover all modifications, equivalents, and alternatives falling within the spirit and scope of the invention as defined by the following appended claims.

What is claimed is:

1. A memory cell comprising:
   a top pinned ferromagnetic layer;
   a bottom pinned ferromagnetic layer;
   a heat generating layer coupled directly to the bottom pinned ferromagnetic layer;
   an antiferromagnetic layer coupled directly to the heat generating layer; and
   a free ferromagnetic layer arranged between the top pinned ferromagnetic layer and the bottom pinned ferromagnetic layer, wherein the memory cell is configured such that a spin torque effect on the free ferromagnetic layer from electrons from the bottom pinned ferromagnetic layer is opposite to a spin torque effect on the free ferromagnetic layer from electrons from the top pinned ferromagnetic layer upon activation.

2. The memory cell, as set forth in claim 1, wherein a direction of magnetization of the top pinned ferromagnetic layer is the same as a direction of magnetization of the bottom pinned ferromagnetic layer.

3. The memory cell, as set forth in claim 1, wherein the memory cell is configured such that when a low current is applied to the bottom pinned ferromagnetic layer, a direction of magnetization of the bottom pinned ferromagnetic layer will be induced onto the free ferromagnetic layer, such that the direction of magnetization of the free ferromagnetic layer is the same as a direction of magnetization of the bottom pinned ferromagnetic layer.

4. The memory cell, as set forth in claim 1, wherein the memory cell is configured such that when a high current is applied to the bottom pinned ferromagnetic layer, a reflected current from the top pinned ferromagnetic layer will cause the direction of magnetization of the free ferromagnetic layer to be opposite a direction of magnetization of the top pinned ferromagnetic layer.

5. The memory cell, as set forth in claim 1, wherein the memory cell is configured to be programmed into a low resistance state when a low current is applied to the bottom pinned ferromagnetic layer, and configured to be programmed into a high resistance state when a high current is applied to the bottom pinned ferromagnetic layer.

6. The memory cell, as set forth in claim 1, wherein the memory cell is configured to be programmed into a low resistance state when a first current is applied in a first direction through the memory cell, and configured to be programmed into a high resistance state when a second current is applied in the first direction.

7. The memory cell, as set forth in claim 1, wherein the heat generating layer is configured to modulate the spin torque effect of the bottom pinned ferromagnetic layer.

8. The memory cell, as set forth in claim 1, wherein the heat generating layer is configured to decrease the magnetization and spin polarization efficiency of the bottom pinned ferromagnetic layer.

9. The memory cell, as set forth in claim 1, wherein the heat generating layer is configured to provide antiferromagnetic coupling between the antiferromagnetic layer and the bottom pinned ferromagnetic layer.

10. A memory cell comprising:
    a top pinned layer;
    a bottom pinned layer;
    a heat generating layer coupled directly to the bottom pinned layer;
    a magnetic tunnel junction formed on the top pinned layer; and
    a free layer arranged between the top pinned layer and the bottom pinned layer, wherein the memory cell is configured such that a spin torque effect on the bottom pinned layer is modulated upon activation.

11. The memory cell, as set forth in claim 10, wherein the memory cell is configured such that a spin torque effect on the bottom pinned layer is modulated by heat transferred from the heat generating layer coupled to the bottom pinned layer.

12. The memory cell, as set forth in claim 10, wherein the heat generating layer is configured to alter a magnetization of the bottom pinned layer upon activation.

13. The memory cell, as set forth in claim 10, wherein each of the top pinned layer, the bottom pinned layer and the free layer are ferromagnetic.

14. The memory cell, as set forth in claim 10, wherein the top pinned layer and the bottom pinned layer are magnetized in the same direction.

15. The memory cell, as set forth in claim 10, wherein each of the top pinned layer, the free layer and the bottom pinned layer is ferromagnetic, and wherein a magnetization of at least one of the top pinned layer and the bottom pinned layer is in a direction perpendicular to a layer plane.

16. The memory cell, as set forth in claim 15, wherein a magnetization of the free layer is in a direction parallel to the layer plane.

17. The memory cell, as set forth in claim 16, comprising an antiferromagnetic layer arranged between the magnetic tunnel junction and the top pinned layer.

18. The memory cell, as set forth in claim 16, comprising a spin randomization separation layer arranged between the magnetic tunnel junction and the top pinned layer.

19. A memory cell comprising:
    a top pinned layer;
    a bottom pinned layer;
    a heat generating layer coupled directly to the bottom pinned layer;
    a magnetic tunnel junction formed on the top pinned layer; and
    a free layer arranged between the top pinned layer and the bottom pinned layer, wherein the memory cell is configured such that a magnetization and a spin polarization efficiency of the bottom pinned layer are reduced upon activation.

20. The memory cell, as set forth in claim 19, wherein the memory cell is configured such that when a low current is applied to the bottom pinned layer, a direction of magnetization of the bottom pinned layer will be induced onto the free layer, such that the direction of magnetization of the free layer is the same as a direction of magnetization of the bottom pinned layer.

21. The memory cell, as set forth in claim 19, wherein the memory cell is configured such that when a high current is applied to the bottom pinned layer, a reflected current from the top pinned layer will cause the direction of magnetization of the free layer to be opposite a direction of magnetization of the top pinned layer.

22. The memory cell, as set forth in claim 19, wherein the memory cell is configured to be programmed into a low resistance state when a low current is applied to the bottom pinned layer, and configured to be programmed into a high resistance state when a high current is applied to the bottom pinned layer.

23. The memory cell, as set forth in claim 19, wherein the memory cell is configured to be programmed into a low resistance state when a first current is applied in a first direction through the memory cell, and configured to be programmed into a high resistance state when a second current is applied in the first direction.

24. The memory cell, as set forth in claim 19, wherein the magnetic tunnel junction is magnetostatically coupled to the free layer to be antiparallel to the free layer.

25. The memory cell, as set forth in claim 19, comprising a nonmagnetic spacer layer arranged between the magnetic tunnel junction and the top pinned layer.

26. The memory cell, as set forth in claim 25, wherein the magnetic tunnel junction comprises:
a sensing free layer;
a sensing pinned layer; and
a nonmagnetic barrier layer disposed between the sensing free layer and the sensing pinned layer.

27. The memory cell, as set forth in claim 26, wherein the sensing pinned layer is formed directly on the nonmagnetic spacer layer, the nonmagnetic barrier layer is formed directly on the sensing pinned layer, and the sensing free layer is formed directly on the nonmagnetic barrier layer.

* * * * *